(12) United States Patent
Cheng et al.

(10) Patent No.: US 7,879,712 B2
(45) Date of Patent: Feb. 1, 2011

(54) METHOD FOR PATTERNING POLYCRYSTALLINE INDIUM TIN OXIDE

(75) Inventors: Chung-Wei Cheng, Miaoli County (TW); Hwei-Shen Chen, Taichung (TW); Jenq-Shyong Chen, Chiayi County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 18 days.

(21) Appl. No.: 12/371,701

(22) Filed: Feb. 16, 2009

(65) Prior Publication Data

US 2010/0105196 A1 Apr. 29, 2010

(30) Foreign Application Priority Data

Oct. 24, 2008 (TW) .............................. 97140993 A

(51) Int. Cl.
*H01L 21/00* (2006.01)
(52) U.S. Cl. ............................... 438/609; 257/E21.158
(58) Field of Classification Search ......... 438/151–166, 438/608–609
See application file for complete search history.

(56) References Cited

U.S. PATENT DOCUMENTS 5,264,072 A * 11/1993 Mukai ........................... 117/43
6,232,156 B1 * 5/2001 Ohtani et al. ................ 438/151
6,953,593 B2 10/2005 Kuhrts

* cited by examiner

*Primary Examiner*—Richard A. Booth
(74) *Attorney, Agent, or Firm*—WPAT, PC; Justin King

(57) ABSTRACT

A method for patterning polycrystalline indium tin oxide by using a Gaussian laser beam focused on an amorphous indium tin oxide layer is disclosed to pattern the non-crystalline amorphous indium tin oxide layer and transfer part of the amorphous indium tin oxide layer into polycrystalline indium tin oxide while the remaining amorphous indium tin oxide layer is etched due to etching selectivity of an etching solution. The method comprises: providing a substrate with an amorphous indium tin oxide layer thereon on a carrier; transferring the amorphous indium tin oxide layer in a predetermined area into a polycrystalline indium tin oxide layer by emitting a Gaussian laser beam focused on the amorphous indium tin oxide layer in the predetermined area; and removing the remaining amorphous indium tin oxide layer on the substrate by an etching solution to form a patterned polycrystalline indium tin oxide layer.

14 Claims, 9 Drawing Sheets

METHOD FOR PATTERNING POLYCRYSTALLINE INDIUM TIN OXIDE

BACKGROUND OF THE INVENTION

1. Field of the Invention

The present invention generally relates to a method for patterning polycrystalline indium tin oxide and, more particularly, to a method for patterning polycrystalline indium tin oxide by using a Gaussian laser beam focused on an amorphous indium tin oxide layer to pattern the non-crystalline amorphous indium tin oxide layer and transfer part of the amorphous indium tin oxide layer into polycrystalline indium tin oxide while the remaining amorphous indium tin oxide layer is etched due to etching selectivity of an etching solution.

2. Description of the Prior Art

In order to improve the device characteristic of the optoelectronic products such as solar cells and flat-panel displays, the amorphous material such as the transparent conductive oxide has to be transferred by thermal treatment into polycrystalline material so as to reduce the resistivity and enhance the transparency. Recently, flexible plastic substrates have attracted tremendous attention. However, plastic substrates cannot stand temperature over, for example, 300° C. Therefore, low-temperature processing is required. Generally, six runs of process (five for pattern transfer and one for thermal treatment) are required to complete the polycrystalline pattern. To overcome the problems due to the multi-step and high-cost process, laser machining is used in some processing steps to ablate the undesired portion of the thin films. However, convention laser machining results in thermal effects to cause elevated ridges on the edge and defects in the layers below.

In U.S. Pat. No. 6,593,593, Nd:YAG laser is used to ablate the zinc oxide (ZnO) and ITO thin films. As shown in FIG. 1, a glass layer 12, an ITO layer 13 and a ZnO layer 14 are formed on a transparent substrate 11. 1064-nm laser is used to ablate the ZnO layer 14 and the ITO layer 13. However, such laser machining suffers from poor precision and thermal effects to cause elevated ridges on the edge and defects in the layers below. Moreover, precision laser optic system for patterning fine line pitch is costly.

In U.S. Pat. No. 6,448,158, excimer laser is used for thermal annealing. As shown in FIG. 2, a laser source 20 is used to emit a 248-nm excimer laser beam 21. The excimer laser beam 21 passes through a beam homogenizer 22, a mask 23 and a focusing lens 24 to perform machining on an ITO layer 27 on a glass substrate 26 disposed on a movable platform 25. However, in this patent, thermal effects resulting from the long-pulse laser lead to poor patterning precision. Moreover, a mask is needed and the patterning of fine line pitch is not available because the precision is limited by the optic diffraction limits.

Therefore, there is need in providing a method for patterning polycrystalline indium tin oxide by using a Gaussian laser beam focused on an amorphous indium tin oxide layer to pattern the non-crystalline amorphous indium tin oxide layer and transfer part of the amorphous indium tin oxide layer into polycrystalline indium tin oxide while the remaining amorphous indium tin oxide layer is etched due to etching selectivity of an etching solution.

SUMMARY OF THE INVENTION

The present invention provides a method for patterning polycrystalline indium tin oxide by using a Gaussian laser beam focused on an amorphous indium tin oxide layer to pattern the non-crystalline amorphous indium tin oxide layer and transfer part of the amorphous indium tin oxide layer into polycrystalline indium tin oxide while the remaining amorphous indium tin oxide layer is etched due to etching selectivity of an etching solution.

The method for patterning polycrystalline indium tin oxide according to the present invention uses a focusing lens set to focus the Gaussian laser source and controls the laser parameters such as the energy profile, the pulse rate, the pulse repetition rate, the scanning speed and the light spot size to perform local heat treatment on an amorphous indium tin oxide layer by direct write. The amorphous indium tin oxide layer is transferred into polycrystalline indium tin oxide after low-energy laser beam illumination. The indium tin oxide layer is patterned by beam scanning and selective etching to remove non-crystalline indium tin oxide.

In one embodiment, the present invention provides a method for patterning polycrystalline indium tin oxide, comprising steps of: providing a substrate with an amorphous indium tin oxide layer thereon on a carrier; transferring the amorphous indium tin oxide layer in a predetermined area into a polycrystalline indium tin oxide layer by emitting a Gaussian laser beam focused on the amorphous indium tin oxide layer in the predetermined area; and removing the remaining amorphous indium tin oxide layer on the substrate by an etching solution to form a patterned polycrystalline indium tin oxide layer.

In another embodiment, the present invention provides a system for patterning polycrystalline indium tin oxide, comprising: a laser source, capable of generating a Gaussian laser beam; a beam adjusting device, capable of adjusting the path and the energy intensity of the Gaussian laser beam; a focusing lens set, capable of focusing the Gaussian laser beam; and a carrier, capable of carrying a substrate with an amorphous indium tin oxide layer thereon.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention can be exemplified but not limited by the embodiments as described hereinafter.

Figure 1:
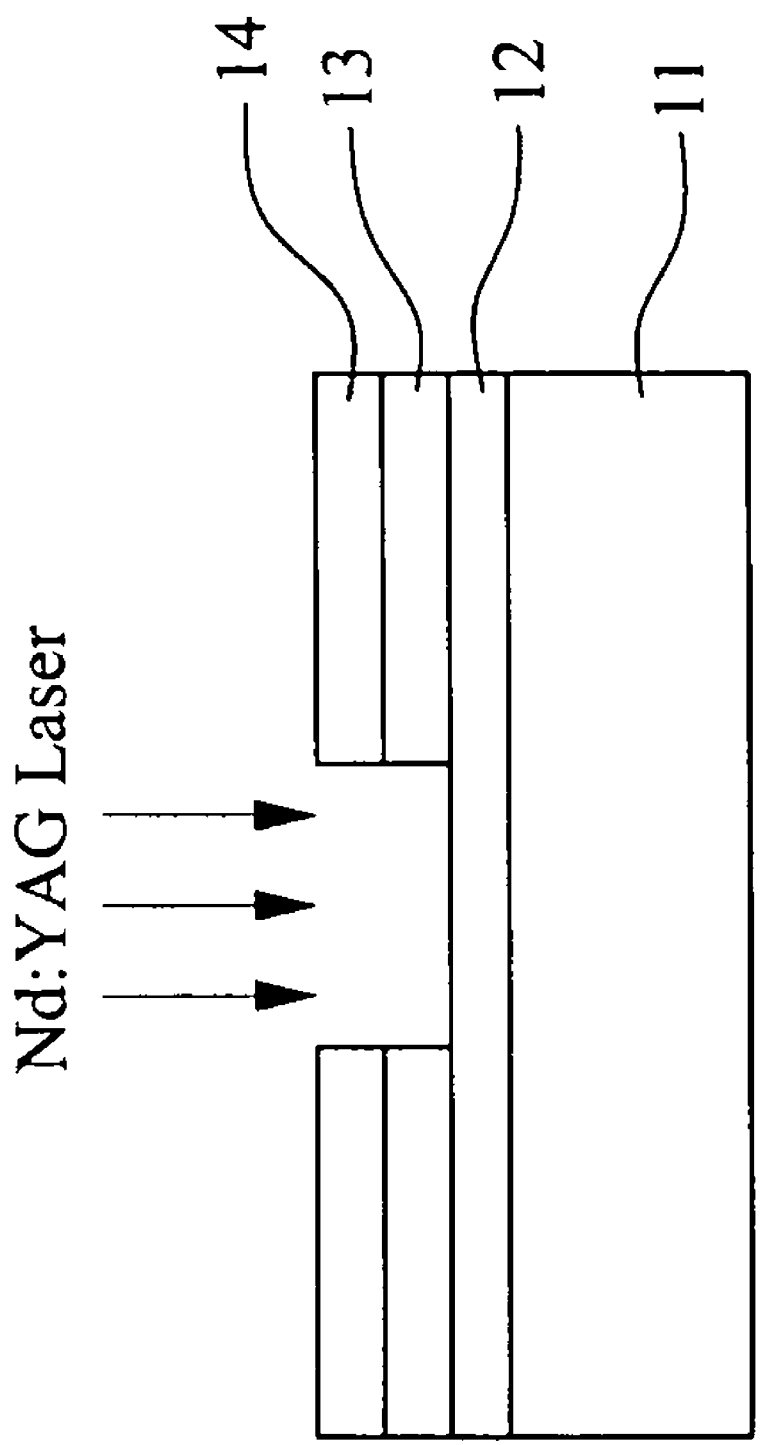
FIG. 1 is a schematic diagram showing the disclosure in U.S. Pat. No. 6,593,593.
Figure 2:
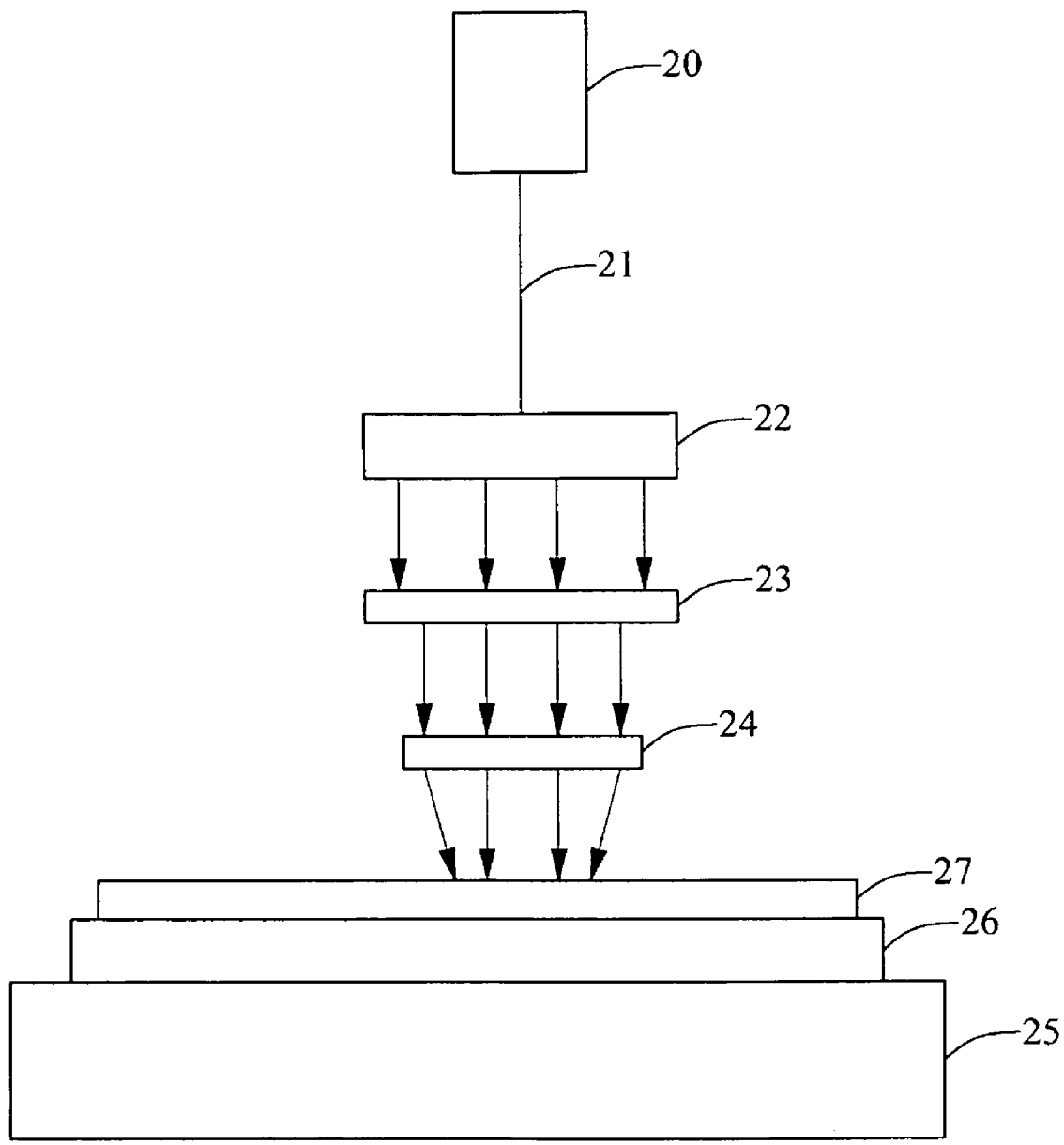
FIG. 2 is a schematic diagram showing the disclosure in U.S. Pat. No. 6,448,158.
Figure 3:
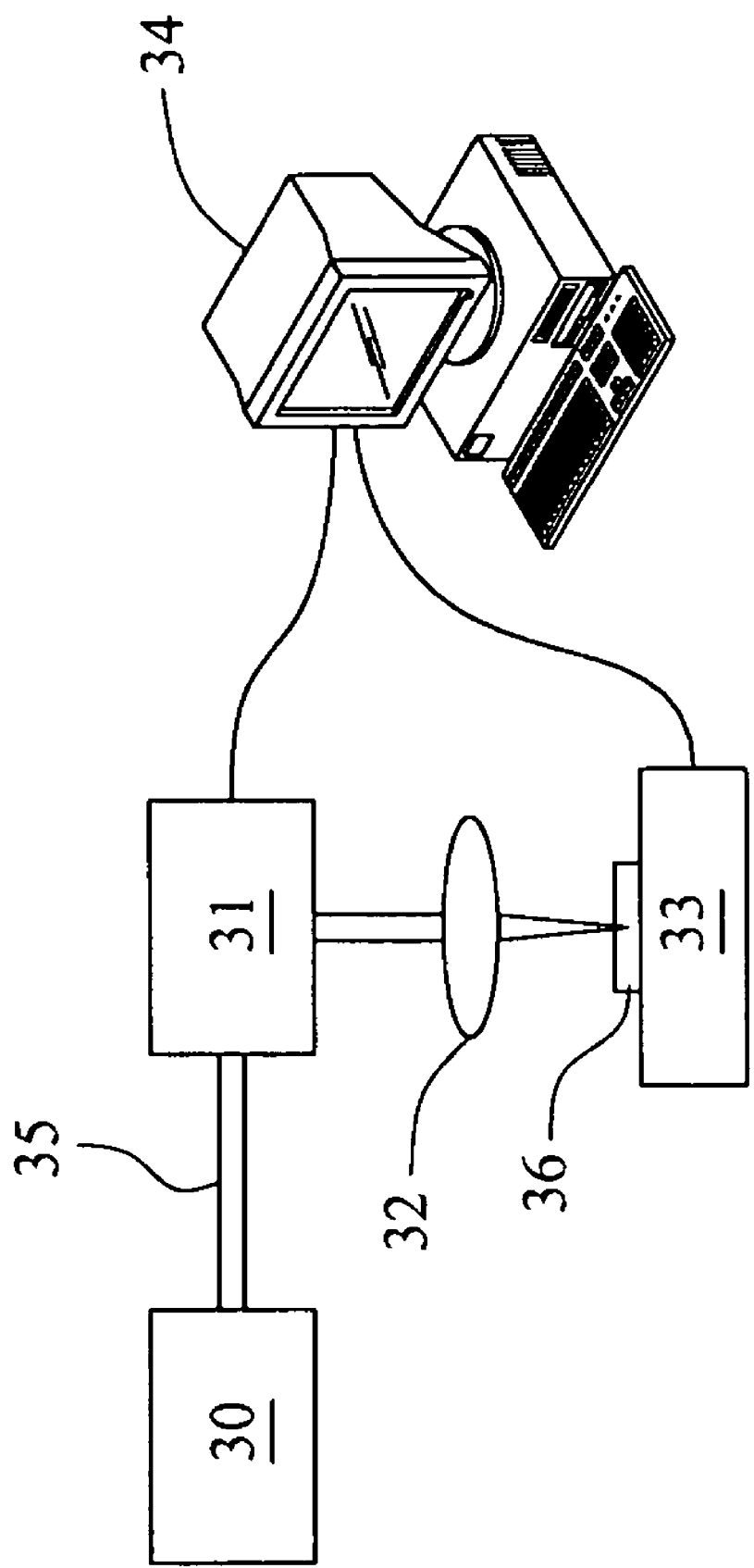
FIG. 3 is a system diagram for transferring amorphous ITO into polycrystalline ITO according to the present invention.

Please refer to FIG. 3, which is a system diagram for transferring amorphous ITO into polycrystalline ITO according to the present invention. The system comprises a laser source 30, a beam adjusting device 31, a focusing lens set 32 and a carrier 33. The laser source 30 is capable of generating a Gaussian laser beam 35. The beam adjusting device 31 is capable of adjusting the path and the energy intensity of the Gaussian laser beam 35. The focusing lens set 32 is capable of focusing the Gaussian laser beam 35. The carrier 33 is capable of moving relatively to the Gaussian laser beam 35 and carrying a substrate 36 with an amorphous ITO layer (not shown) formed thereon. To further monitor the system, the system further comprises an integrated control device 34 capable of monitoring the surface of the polycrystalline indium tin oxide layer to further optimize the process.

Therefore, after the laser source 30 is turned on, the Gaussian laser beam 35 is reflected by the beam adjusting device 31 and focused by the f focusing lens set 32 to illuminate the substrate 36 on the carrier 33. The amorphous ITO layer on the substrate 36 is heated up after laser illumination. As the laser intensity exceeds the intensity threshold for crystallization, the amorphous ITO layer is transferred into a polycrystalline ITO layer. Meanwhile, the carrier 33 is capable of moving relatively to the Gaussian laser beam 35 so that patterned polycrystalline ITO can be formed on the substrate 36.

Afterwards, an etching solution is used to remove the amorphous ITO layer on the substrate 36 due to etching selectivity of the etching solution. In the present invention, 50° C. oxalic acid heated up for less than 5 minutes is used to remove the amorphous ITO layer. Alternatively, nitro-hydrochloric acid, hydrochloric acid or the like can also be used as an etching solution to remove the amorphous ITO layer.

Figure 4:
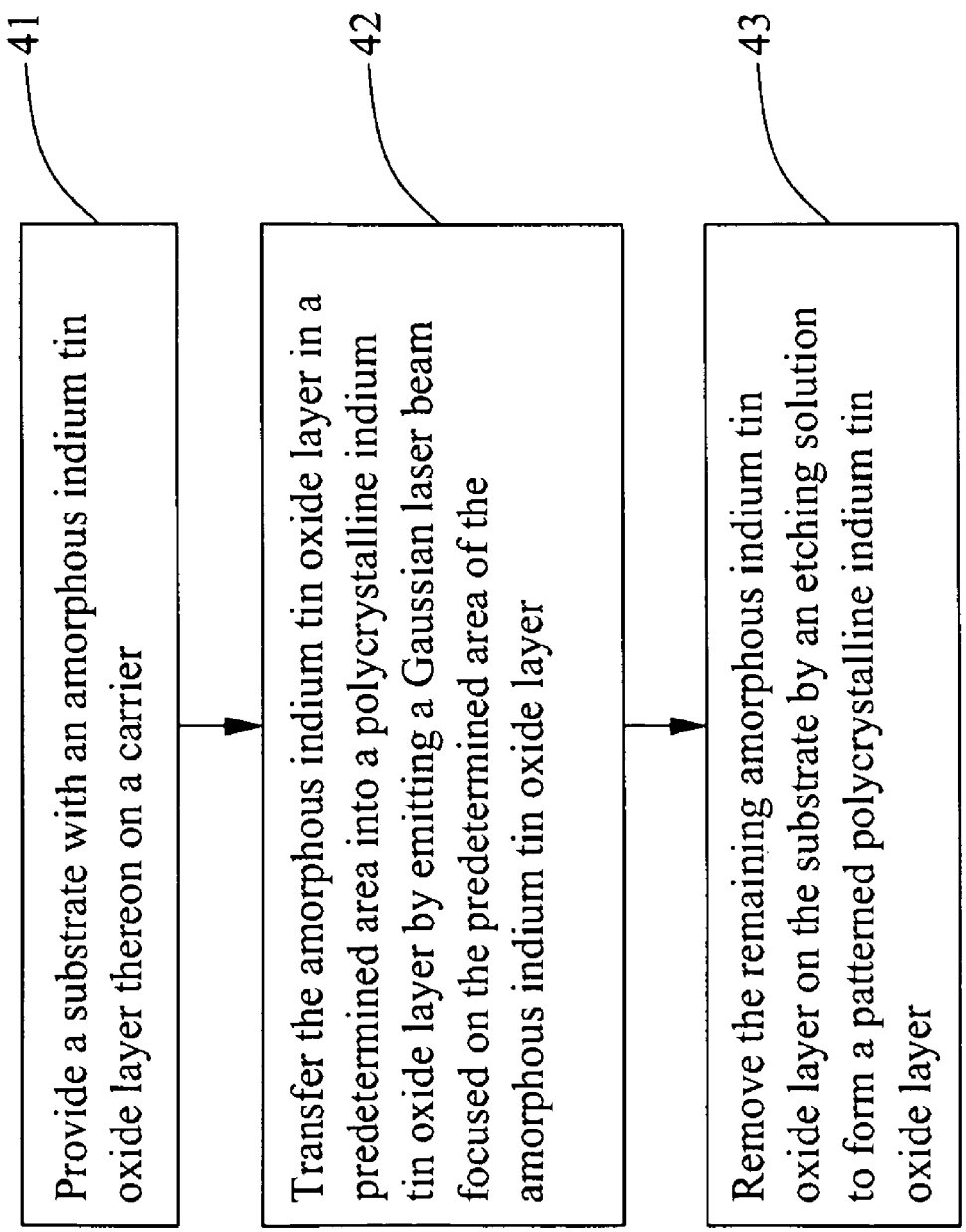
FIG. 4 is a flowchart of a method for patterning polycrystalline indium tin oxide according to the present invention.

Therefore, the method for patterning polycrystalline indium tin oxide of the present invention comprises steps as described in FIG. 4.

In Step 41, a substrate is provided with an amorphous indium tin oxide layer thereon on a carrier.

In Step 42, the amorphous indium tin oxide layer in a predetermined area is transferred into a polycrystalline indium tin oxide layer by emitting a Gaussian laser beam focused on the amorphous indium tin oxide layer in the predetermined area.

In Step 43, the remaining amorphous indium tin oxide layer on the substrate is removed by an etching solution to form a patterned polycrystalline indium tin oxide layer.

Figure 5:
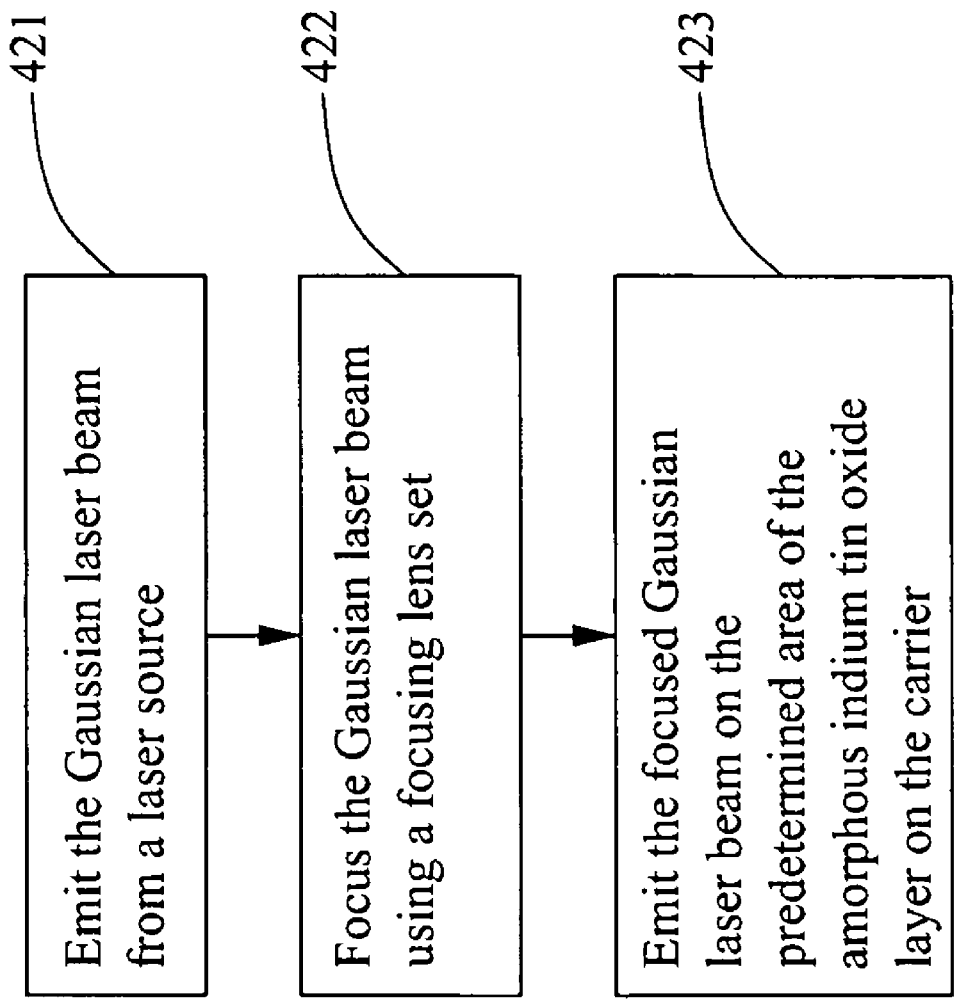
FIG. 5 is a flowchart of a step of emitting a Gaussian laser beam according to the present invention.

More particularly, referring to FIG. 5 and the system in FIG. 3, Step 42 further comprises:

In Step 421, a laser source is used to generate the Gaussian laser beam.

In Step 422, a focusing lens set is used to focus the Gaussian laser beam.

In Step 423, the focused Gaussian laser beam is emitted onto the amorphous indium tin oxide layer in the predetermined area on the carrier.

In the present invention, the amorphous indium tin oxide layer and the Gaussian laser beam are moved relatively. For example, the carrier is moved relatively to the Gaussian laser beam or the Gaussian laser beam is moved relatively to the carrier.

In the present invention, the substrate is glass or plastic. The thickness of the amorphous ITO layer on the substrate is preferably within a range from 50 to 300 nm. The wavelength of the laser source is preferably within a range from 100 to 2000 nm. The focusing lens set comprises a plurality of lenses so that the focused Gaussian laser beam intensity is within the range from 0.01 to 10 J/cm$^2$.

Figure 6:
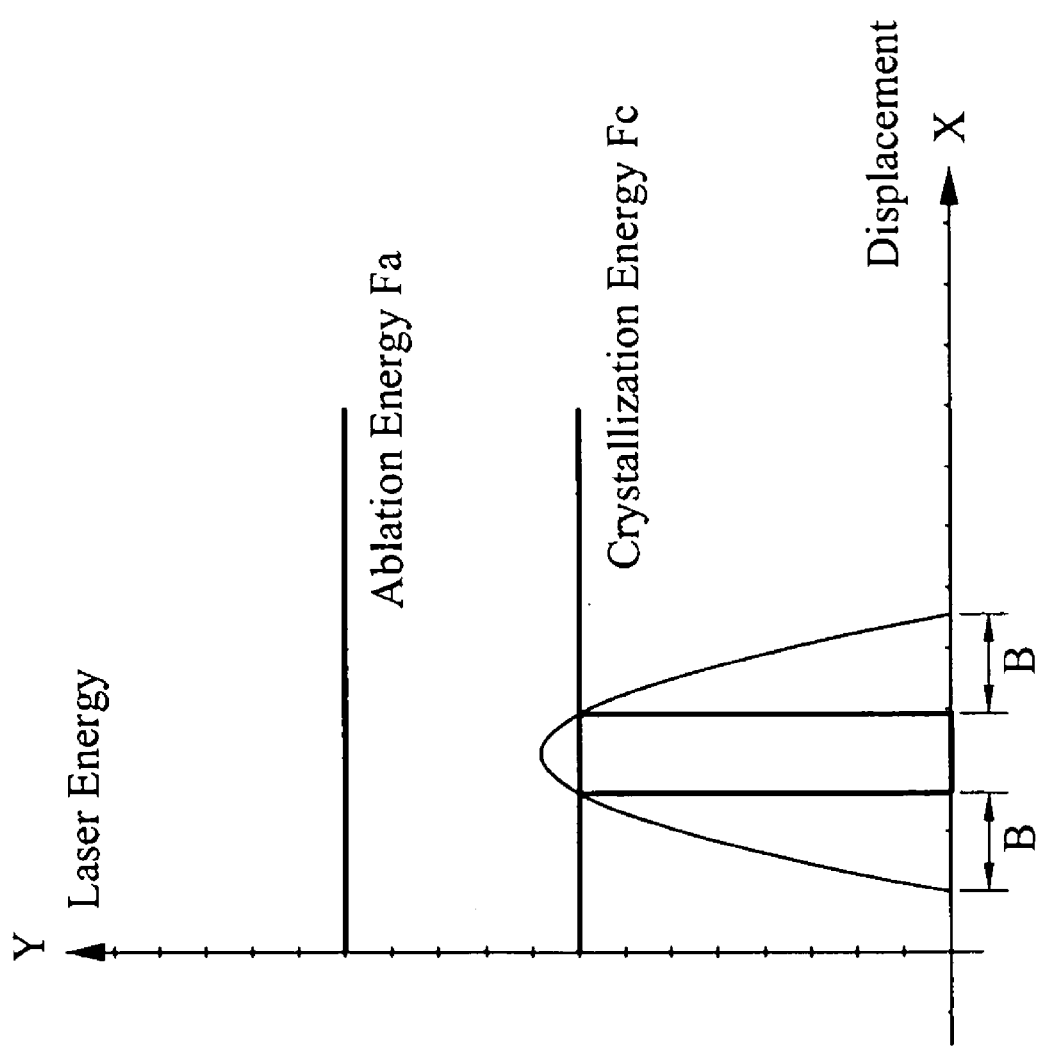
FIG. 6 is an energy distribution profile of the Gaussian laser beam in FIG. 5 according to one embodiment of the present invention.

In the present invention, the energy intensity profile of the Gaussian laser beam is adjusted by a beam adjusting device within a specific range. FIG. 6 is an energy distribution profile of the Gaussian laser beam in FIG. 5 according to one embodiment of the present invention. In FIG. 6, the peak energy intensity of the Gaussian laser beam is adjusted between a thermal crystallization energy threshold Fc of indium tin oxide and an ablation energy threshold Fa of indium tin oxide. The part of amorphous indium tin oxide where the peak energy intensity is larger than the thermal crystallization energy threshold Fc is crystallized into polycrystalline indium tin oxide.

Figure 7:
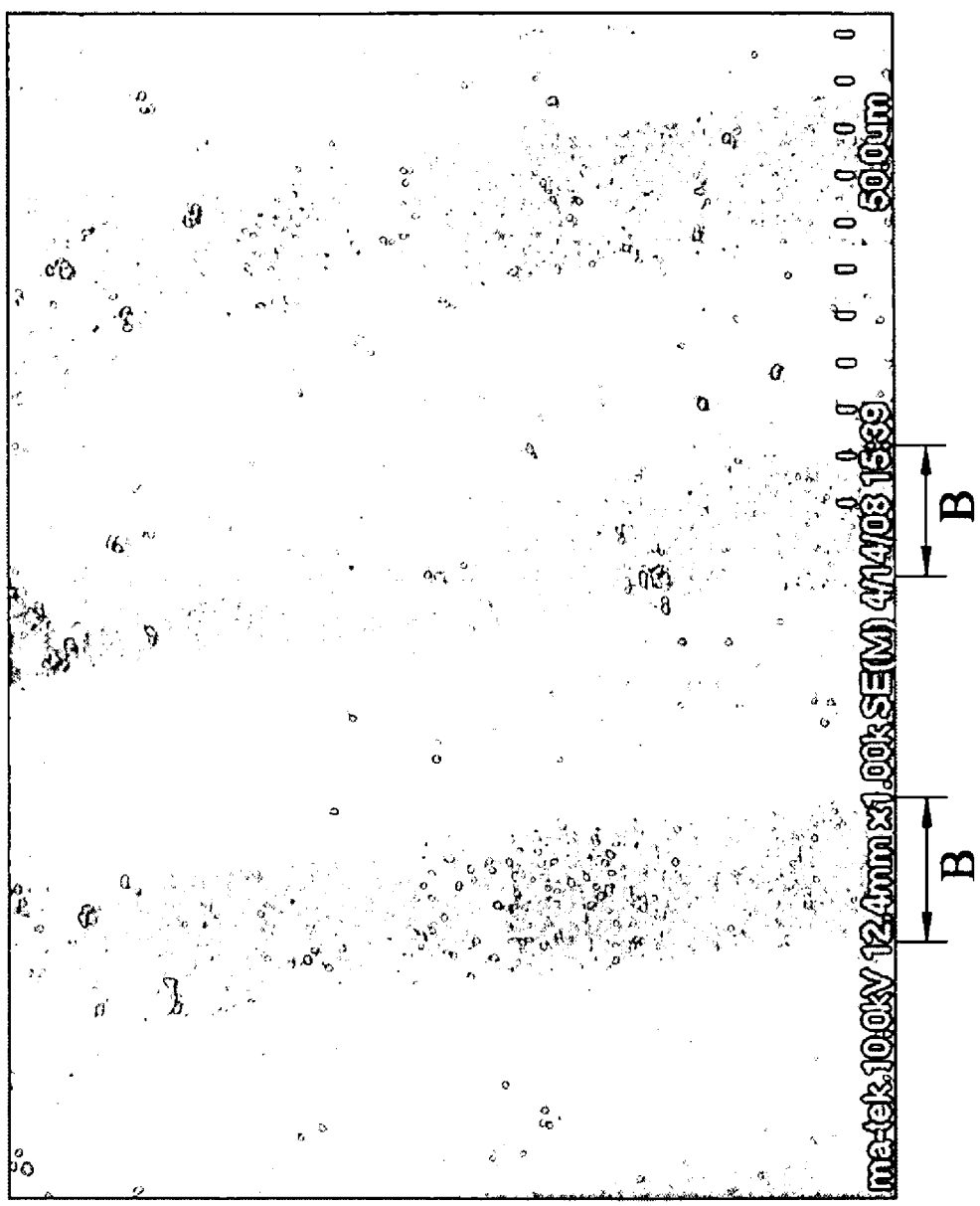
FIG. 7 is an SEM picture of an etched indium tin oxide layer after laser illumination according to the energy distribution profile of the Gaussian laser beam in FIG. 6.

FIG. 7 is an SEM picture of an etched indium tin oxide layer after laser illumination according to the energy distribution profile of the Gaussian laser beam in FIG. 6. In FIG. 7, the un-illuminated amorphous indium tin oxide is removed by an etching solution to form a patterned polycrystalline indium tin oxide (the portion B in FIG. 7). Obviously, when the light spot size of the focused Gaussian laser beam is about 56 μm, the resulted line width is about 20 μm (the portion B in FIG. 7).

Figure 8:
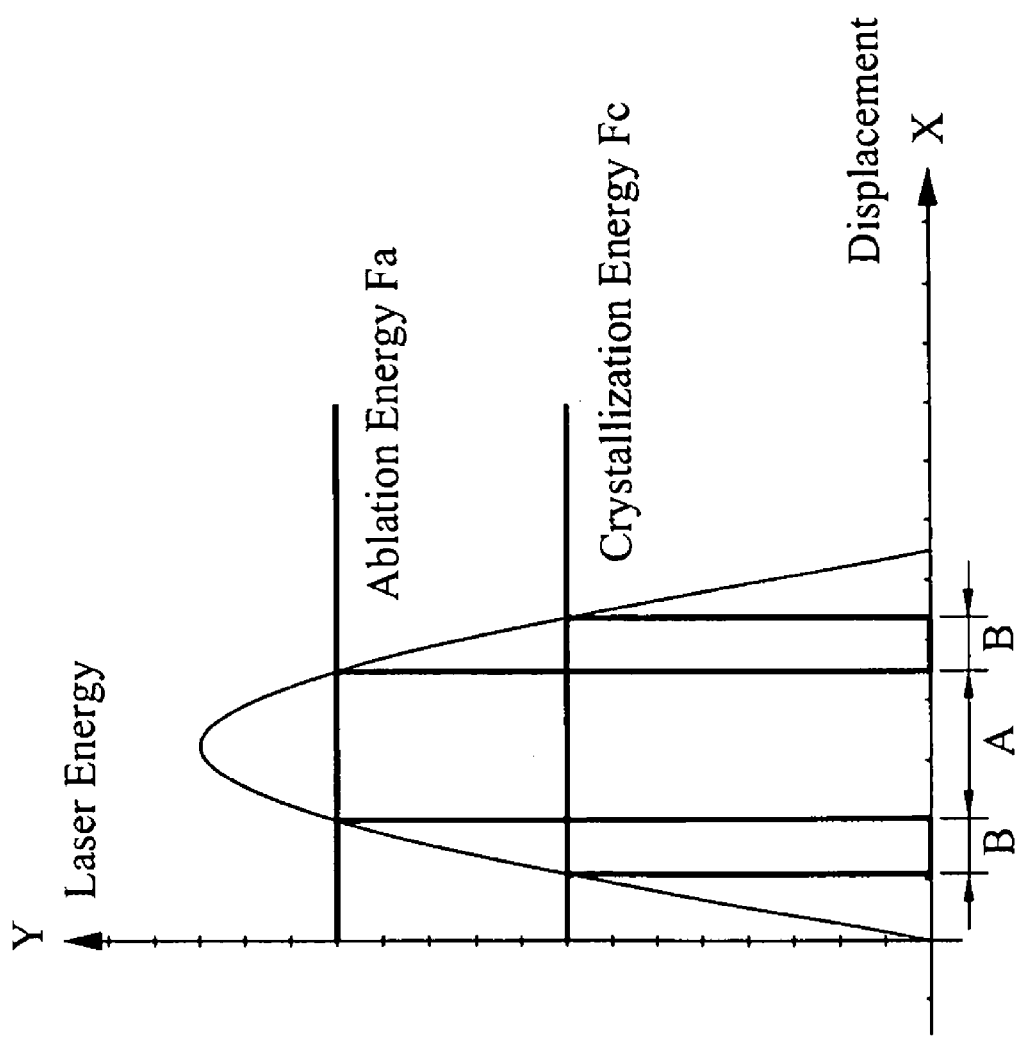
FIG. 8 is an energy distribution profile of the Gaussian laser beam in FIG. 5 according to another embodiment of the present invention.

FIG. 8 is an energy distribution profile of the Gaussian laser beam in FIG. 5 according to another embodiment of the present invention. In FIG. 8, the peak energy intensity of the Gaussian laser beam is adjusted larger than an ablation energy threshold Fa of indium tin oxide, resulting in ablation of the part of indium tin oxide (portion A) where the peak energy intensity is larger than the ablation energy threshold Fa.

Figure 9:
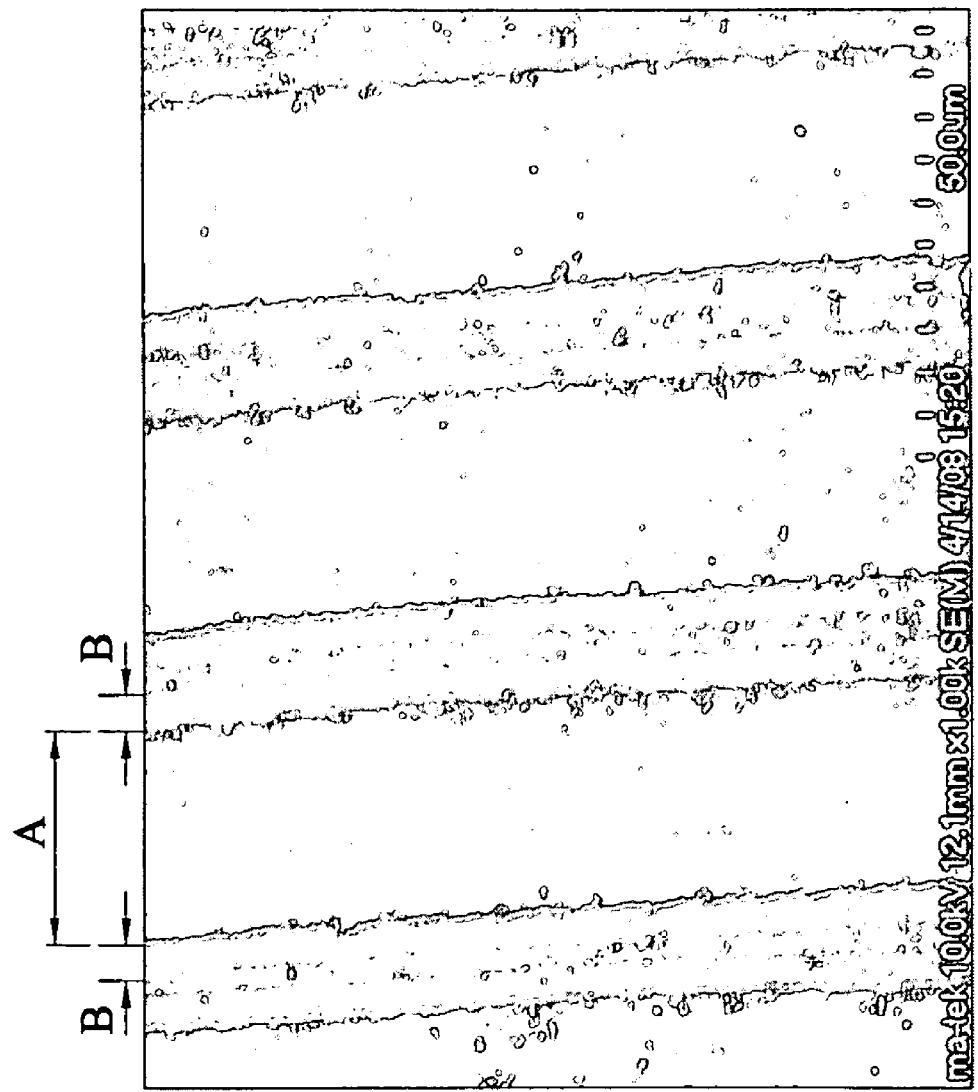
FIG. 9 is an SEM picture of an etched indium tin oxide layer after laser illumination according to the energy distribution profile of the Gaussian laser beam in FIG. 8.

FIG. 9 is an SEM picture of an etched indium tin oxide layer after laser illumination according to the energy distribution profile of the Gaussian laser beam in FIG. 8. In FIG. 9, the un-illuminated amorphous indium tin oxide is removed by an etching solution to form a patterned polycrystalline indium tin oxide (the portion B in FIG. 9). When the light spot size of the focused Gaussian laser beam is about 56 μm, the resulted line width is about 5 μm (the portion B in FIG. 9).

Accordingly, the present invention discloses a method for patterning polycrystalline indium tin oxide by using a Gaussian laser beam focused on an amorphous indium tin oxide layer to pattern the non-crystalline amorphous indium tin oxide layer and transfer part of the amorphous indium tin oxide layer into polycrystalline indium tin oxide while the remaining amorphous indium tin oxide layer is etched due to etching selectivity of an etching solution. Therefore, the present invention is useful, novel and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for patterning polycrystalline indium tin oxide, comprising the steps of:
providing a substrate with an amorphous indium tin oxide layer thereon on a carrier;
transferring the amorphous indium tin oxide layer in a predetermined area into a polycrystalline indium tin oxide layer by emitting a Gaussian laser beam focused on the amorphous indium tin oxide layer in the predetermined area by using a focusing lens set comprising a plurality of lenses such that the focused Gaussian laser beam intensity is within the range of 0.01 to 10 J/cm$^2$; and remaining the remaining amorphous indium tin oxide layer on the substrate by an etching solution to form a patterned polycrystalline indium tin oxide layer.

2. The method for patterning polycrystalline indium tin oxide as recited in claim 1, further comprising:

moving the carrier relatively to the Gaussian laser beam.

3. The method for patterning polycrystalline indium tin oxide as recited in claim 1, further comprising:

moving the Gaussian laser beam relatively to the carrier.

4. The method for patterning polycrystalline indium tin oxide as recited in claim 1, wherein the peak energy intensity of the Gaussian laser beam is adjusted between a thermal crystallization energy threshold of indium tin oxide and an ablation energy threshold of indium tin oxide by a beam adjusting device.

5. The method for patterning polycrystalline indium tin oxide as recited in claim 1, wherein the peak energy intensity of the Gaussian laser beam is adjusted larger than an ablation energy threshold of indium tin oxide by a beam adjusting device.

6. The method for patterning polycrystalline indium tin oxide as recited in claim 1, wherein the etching solution is oxalic acid, nitro-hydrochloric acid or hydrochloric acid.

7. The method for patterning polycrystalline indium tin oxide as recited in claim 1, wherein the step of emitting a Gaussian laser beam further comprises:

using a laser source to generate the Gaussian laser beam;

focusing the Gaussian laser beam by a focusing lens set; and emitting the focused Gaussian laser beam on the amorphous indium tin oxide layer in the predetermined area on the carrier.

8. The method for patterning polycrystalline indium tin oxide as recited in claim 7, wherein the focusing lens set comprises at least a lens.

9. The method for patterning polycrystalline indium tin oxide as recited in claim 7, further comprising:

moving the carrier relatively to the Gaussian laser beam.

10. The method for patterning polycrystalline indium tin oxide as recited in claim 7, further comprising:

moving the Gaussian laser beam relatively to the carrier.

11. The method for patterning polycrystalline indium tin oxide as recited in claim 7, wherein the peak energy intensity of the Gaussian laser beam is adjusted between a thermal crystallization energy threshold of indium tin oxide and an ablation energy threshold of indium tin oxide by a beam adjusting device.

12. The method for patterning polycrystalline indium tin oxide as recited in claim 7, wherein the peak energy intensity of the Gaussian laser beam is adjusted larger than an ablation energy threshold of indium tin oxide by a beam adjusting device.

13. The method for patterning polycrystalline indium tin oxide as recited in claim 1, wherein the amorphous ITO layer has a thickness of 50 nm to 300 nm.

14. The method for patterning polycrystalline indium tin oxide as recited in claim 1, wherein the Gaussian laser has a wavelength of 100 nm to 2000 nm.

* * * * *